(12) United States Patent
Friedrichs

(10) Patent No.: US 7,777,553 B2
(45) Date of Patent: Aug. 17, 2010

(54) SIMPLIFIED SWITCHING CIRCUIT

(75) Inventor: Peter Friedrichs, Nuremberg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/099,372

(22) Filed: Apr. 8, 2008

(65) Prior Publication Data

US 2009/0251197 A1 Oct. 8, 2009

(51) Int. Cl.
*H03K 17/687* (2006.01)

(52) U.S. Cl. ........................................ 327/436

(58) Field of Classification Search ............... 327/436
See application file for complete search history.

(56) References Cited

U.S. PATENT DOCUMENTS

| | | | |
|---|---|---|---|
| 3,509,375 A * | 4/1970 | Gormley | 327/424 |
| 3,775,693 A * | 11/1973 | Proebsting | 326/120 |
| 3,991,326 A * | 11/1976 | Kawagoe et al. | 326/87 |
| 4,042,839 A * | 8/1977 | Araki | 326/117 |
| 4,264,829 A * | 4/1981 | Misaizu | 326/120 |
| 4,663,547 A | 5/1987 | Baliga et al. | |
| 4,677,315 A * | 6/1987 | Blauschild et al. | 327/73 |
| 4,945,266 A * | 7/1990 | Mori | 327/428 |
| 6,157,049 A | 12/2000 | Mitlehner et al. | |
| 6,255,890 B1 * | 7/2001 | Aiello et al. | 327/432 |
| 6,696,880 B2 * | 2/2004 | Pan et al. | 327/390 |
| 7,082,020 B2 * | 7/2006 | Friedrichs et al. | 361/93.9 |
| 7,173,473 B2 | 2/2007 | Terletzki et al. | |
| 7,206,178 B2 | 4/2007 | Friedrichs et al. | |
| 7,272,046 B2 * | 9/2007 | Tanzawa | 365/185.18 |
| 7,327,053 B2 | 2/2008 | Eckardt et al. | |
| 7,619,462 B2 * | 11/2009 | Kelly et al. | 327/427 |
| 2006/0199563 A1 * | 9/2006 | Kelly et al. | 455/333 |
| 2008/0253151 A1 * | 10/2008 | Bahramian | 363/22 |

FOREIGN PATENT DOCUMENTS

DE 196 10 135 C1 6/1997

OTHER PUBLICATIONS

Mino, K., et al., "A Gate Drive Circuit for Silicon Carbide JFET," Swiss Federal Institute of Technology (ETH) Zurich, IEEE, 2003, pp. 1162-1166.

* cited by examiner

*Primary Examiner*—Lincoln Donovan
*Assistant Examiner*—William Hernandez
(74) *Attorney, Agent, or Firm*—Slater & Matsil, L.L.P.

(57) ABSTRACT

An embodiment of the invention relates to a switching system that includes a depletion-mode semiconductor device, such as a silicon carbide device, coupled in series with an enhancement-mode semiconductor device, such as a silicon field effect transistor, so that a controller can be configured to disable conductivity of the series arrangement of the two switches during a transient operating condition. During normal high-frequency switching operation, the controller persistently enables the enhancement-mode device to conduct while intermittently enabling the depletion-mode device to conduct. The controller disables the enhancement-mode device to conduct during a transient operating condition such as start up or during a fault, thereby providing circuit protection during such transients. The switching system preserves low loss switching characteristics of the depletion-mode device in a high-frequency switching circuit.

18 Claims, 3 Drawing Sheets

SIMPLIFIED SWITCHING CIRCUIT

TECHNICAL FIELD

An embodiment of the invention relates generally to semiconductor switching devices and methods, and more particularly to controlling a normally "on" semiconductor device in a circuit that requires a blocking device during startup or during other transient operating conditions.

BACKGROUND

Semiconductor devices designed for high-frequency and high-voltage switching applications, particularly those designed for pulse-width controlled power conversion, are increasingly designed with compound semiconductor materials such as silicon carbide. These materials exhibit a wide bandgap between valence and conduction bands, and reasonably high mobility for free carriers. In addition, they can withstand a high internal electric field without breakdown, such as an electric field greater then $10^6$ volts per centimeter ("cm") that can be sustained in silicon carbide. The result is a device with excellent switching, voltage blocking, and conduction properties in high-power applications. Compared to a device as commonly formed with silicon, such compound semiconductor devices provide substantially improved performance in high-power circuits with only modest switching losses at relatively high switching frequencies.

However, high performance devices formed of compound semiconductors are often normally on devices. A normally on device is highly conductive when zero volts is applied to its control terminal, i.e., its gate. A normally on characteristic is generally difficult to apply in power switching applications due to the short circuit that can be produced when an end product is initially coupled to a power source.

A number of circuit arrangements, generally referred to as "cascode" circuits, are known to circumvent the short circuit that is created when an end product incorporating a normally on device is initially coupled to a power source. A cascode circuit also includes a silicon-based device that is normally "off" in series with the normally on device so that the series combination presents a normally off conduction condition when zero volts is applied to a control terminal. However, high-frequency switching characteristics of such cascode circuits are generally substantially inferior to those obtainable with a compound semiconductor device operating alone.

Thus, there is a need for a circuit arrangement including a normally on compound semiconductor device capable of blocking current flow when zero volts is applied to a control terminal that avoids the degradation of high-frequency switching performance that ordinarily occurs with the use of a normally off, cascode circuit arrangement.

SUMMARY OF THE INVENTION

In accordance with an exemplary embodiment, a switching system and a related method are provided. In an embodiment, a controller controls the gates of a cascode arrangement of semiconductor devices, the current paths of which are coupled in series. One of the semiconductor devices is an enhancement-mode device, and the other, a depletion-mode device. In an embodiment, the controller causes the enhancement-mode device to persistently conduct and the depletion-mode device to intermittently conduct, thereby to intermittently control a conductivity of the switching system. In an embodiment, the controller disables conduction of the enhancement-mode semiconductor device during a transient operating condition of the switching system.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views. For a more complete understanding of the invention, reference is now made to the following descriptions taken in conjunction with the accompanying drawings, in which:

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely a switching system formed with a controller that controls the gates of a cascode arrangement of semiconductor devices, the current paths of which are coupled in series, wherein one of the semiconductor devices is an enhancement-mode device, and the other, a depletion-mode device.

An embodiment of the invention may be applied to various power-switching arrangements, for example, to a power system including a power converter. Other power switching arrangements can be constructed using a switching system in different contexts using inventive concepts described herein, for example, a switching system to open a connection to a voltage source.

Switching circuit devices such as MOSFETs (metal oxide silicon field effect transistors) based on silicon carbide or other compound semiconductor materials generally offer substantially better conduction, voltage blocking, and switching characteristics than are currently available with conventional silicon-based devices, particularly at high operating voltages. However, the best silicon carbide JFET (junction field effect transistor) devices that are currently available are depletion-mode device, i.e., they are normally conductive when zero potential is applied to its gate with respect to its source. As described above, an enhancement-mode device, i.e., a device that does not conduct unless a nonzero, generally positive potential is applied at its gate, is usually required for a product design to avoid a short-circuit (i.e., a low resistance) condition during a transient operating condition. Such a transient operating condition is generally a concern at start up, at shut-down, or during a fault condition when an active control circuit to apply a negative potential to the gate of the normally on device may not be operative.

Figure 1:
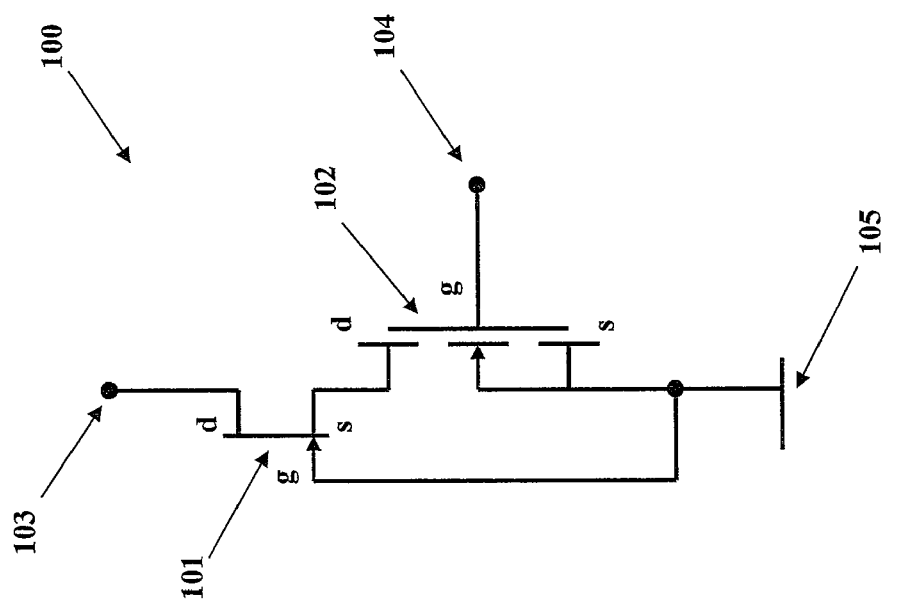
FIG. 1 illustrates a schematic drawing of a conventional cascode circuit formed with a normally on device.

FIG. 1 shows a conventional three-terminal cascode circuit arrangement wherein a normally off silicon MOSFET is coupled in series with a normally on field controlled thyristor or a normally on JFET (junction field effect transistor) that would be formed of a compound semiconductor. The drains, sources, and gates of these devices are labeled d, s, and g, respectively. The gate of the JFET is directly coupled to the source of the silicon MOSFET, thereby forming a three-terminal circuit wherein the series combination of the normally off MOSFET and the normally on JFET forms a normally off circuit.

The cascode circuit of FIG. 1 is formed with a high-voltage, normally on device 101, such as a JFET, with a current path coupled in series with the current path of a normally off MOSFET 102, such as a silicon MOSFET. A three-terminal circuit is thereby formed with switched terminals 103 and 105. The gate terminal 104 of the silicon MOSFET is the third terminal of the circuit, and operates as a control terminal for the series combination of the two devices forming the cascode circuit.

The use only of a normally on high-voltage device, nonetheless, can provide certain benefits compared to a cascode circuit arrangement such as that illustrated in FIG. 1, by enabling higher switching frequencies and reduction of total circuit power losses.

Thus, although a normally on compound semiconductor device such as a JFET can provide substantial advantages in high-power/high-frequency applications, particular precautions should be taken to prevent a short circuit during transient operating conditions. Particular precautions should also be taken in the event of a circuit failure that could compromise the operation of the device wherein generation of a control voltage to disable its normally on conductive mode would be compromised.

In various embodiments, the present invention solves the problem of providing low losses at high switching frequencies while preserving the ability to prevent a short circuit during a transient operating condition with the use of a normally on semiconductor device is provided in an embodiment wherein the fixed connection in a cascode circuit of the gate of a JFET to the source of a series-coupled silicon MOSFET is opened. The gate of a depletion-mode JFET is now coupled to a driver to accept a high-frequency signal to directly switch the cascode arrangement of the JFET and the series coupled, enhancement-mode MOSFET. A second driver disables the JFET conductivity during start-up, in the event of a circuit failure, or due to an operational error. The high-frequency signal switches only the JFET, while switching of the enhancement-mode MOSFET is retained to separately provide circuit protection during a transient operating condition. The enhancement-mode MOSFET is ordinarily maintained in a conducting state during high-frequency switching of the JFET.

Figure 2:
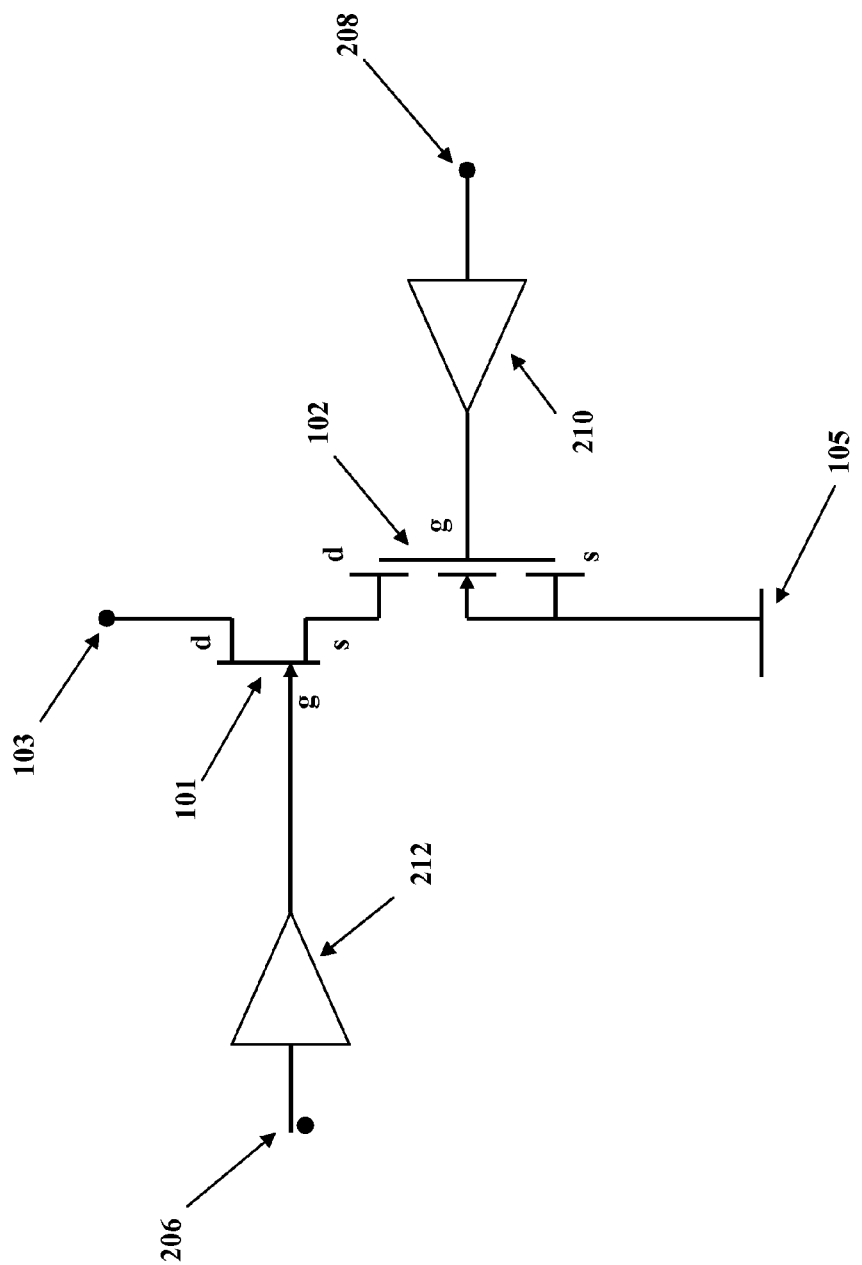
FIG. 2 illustrates a schematic drawing showing a cascode circuit arrangement including a normally on semiconductor device with a current path coupled in series with a current path of a normally off semiconductor device, constructed according to an exemplary embodiment.

Turning now to FIG. 2, illustrated is a schematic drawing showing a cascode circuit arrangement including a normally on JFET 101 with a current path coupled in series with a current path of a normally off MOSFET 102, constructed according to an embodiment. The drains, sources, and gates of these devices are again labeled d, s, and g, respectively. The gate of MOSFET 102 is coupled to driver 210 to provide a normally off series arrangement of the JFET the MOSFET during a transient operating condition. For example, at start up without bias voltages present, the driver 210 can be easily designed to present zero volts to the gate of MOSFET 102. Accordingly, MOSFET 102 can thus be easily arranged to present an open circuit between its source and drain during such a start up or other transient operating condition. Once bias voltages have been established by the circuit and the switching logic is in a normal operating condition, the driver 210 would be configured to enable conduction in MOSFET 102 in response to a signal at its input terminal 208. The inclusion of a MOSFET, which can be a low-voltage device, with its current path coupled in series with the current path of the JFET adds relatively little series resistance to the circuit due to the low voltage rating of a MOSFET that can be used. The resistance of a MOSFET varies roughly as the inverse of the 2.5 power of its rated blocking voltage. Thus, a low voltage rated MOSFET can generally exhibit low on-state resistance.

Driver 212 presents a signal to the gate of JFET 101 to switch the JFET 101, advantageously with little loss at a high switching frequency. Accordingly, driver 212 is configured to present a negative voltage to the gate of JFET 101 to disable conduction therein during a normal operating condition of the circuit. Since MOSFET 102 is maintained in a fully conducting state during high-frequency switching of JFET 101, low loss, high-frequency switching characteristics of the JFET are preserved. Preferably, driver 212 would be configured to drive the gate of JFET 101 with a drive voltage relative to the source of MOSFET 102, i.e., relative to local circuit ground 105. Accordingly, the high-voltage blocking capability of JFET 101 is retained by the cascode circuit when MOSFET 102 is disabled to conduct, e.g., at startup when the gate voltage of MOSFET 102 is zero with respect to its source.

Summarizing operation of the circuit, during startup, shutdown, or a fault condition, both driver outputs are at zero volts with respect to local ground. The small positive voltage developed at the drain of MOSFET 102 disables conductivity of JFET 101, enabling JFET 101 to be the principal circuit element blocking conductivity of the cascode circuit. During normal high-frequency switching operation, MOSFET 102 is enabled to conduct by a positive voltage applied to its gate. The high-frequency switching action of the circuit is produced by an alternating zero and negative gate-drive voltage applied to the gate of JFET 101.

An advantage of configuring the cascode circuit with independent control of the gate of the JFET and the gate of the MOSFET maintains the low loss, high-frequency switching characteristics of the depletion-mode JFET while guaranteeing safe operation during a transient operating condition by the series current path through the enhancement-mode silicon MOSFET. In addition, independent control of the gate of the MOSFET can be used to disable conductivity of the circuit during a fault condition.

Figure 3:
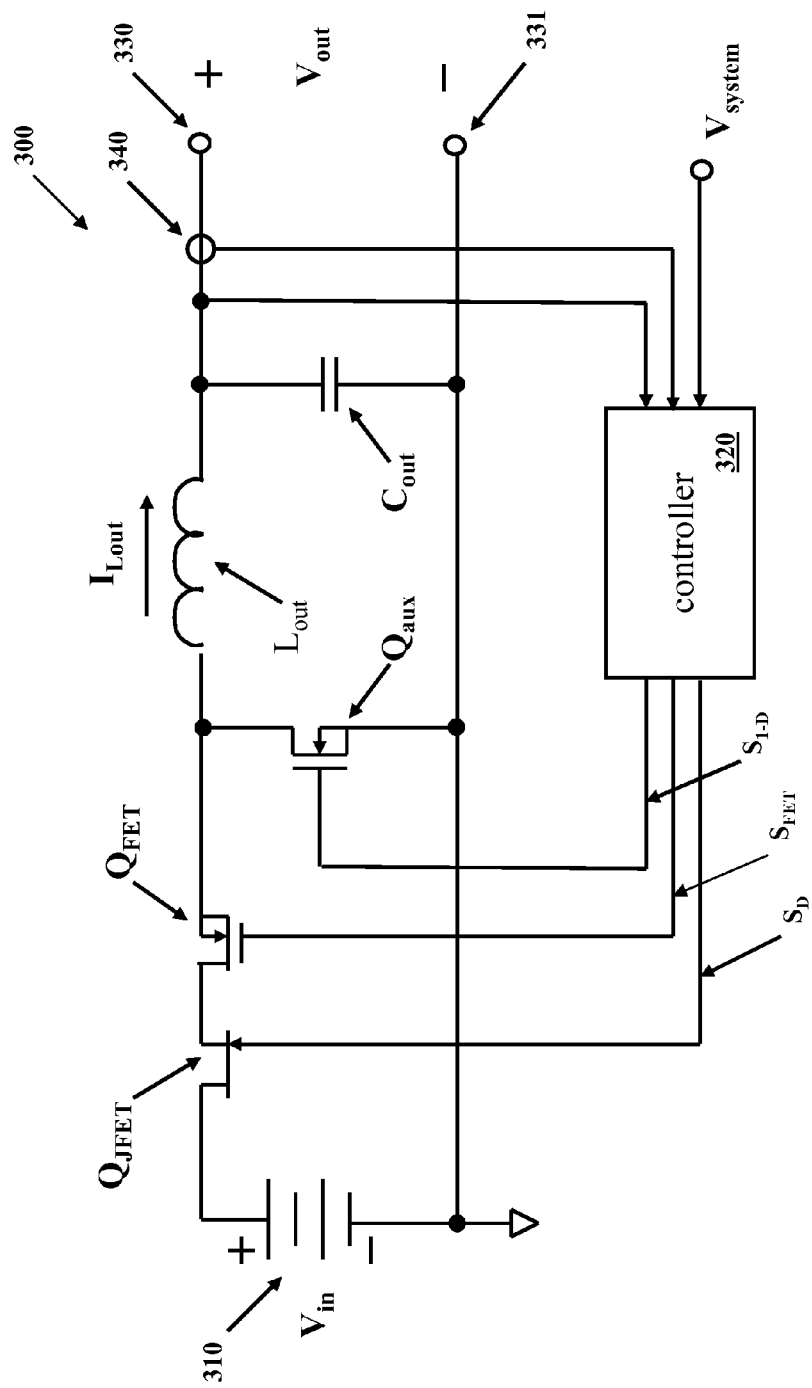
FIG. 3 illustrates a schematic diagram of an embodiment of a power train of a power converter, constructed according to an exemplary embodiment.

Referring now to FIG. 3, illustrated is a simplified schematic diagram of an embodiment of a power train 300 of a power converter that illustrates application of the principles introduced herein. The power converter includes a controller 320 that regulates a power converter output characteristic such as an output voltage. The controller 320 in turn includes drivers such as illustrated and described with reference to FIG. 2. The power converter provides power to a system/load (not shown) coupled to output terminals 330 and 331. While in the illustrated embodiment the power train employs a buck converter topology, those skilled in the art should understand that other converter topologies are well within the broad scope of the present invention.

The power train of the power converter receives an input voltage $V_{in}$ from a source of electrical power (represented by battery 310) at an input thereof and provides a regulated output voltage $V_{out}$ or other output characteristic at output terminals 330 and 331. The input voltage $V_{in}$ may be sufficiently high to generate a preference for the use of a compound semiconductor device to provide low switching losses, i.e., the power switch $Q_{JFET}$. The compound semiconductor device $Q_{JFET}$ generally would have a normally on switching characteristic. In keeping with the principles of a buck converter topology, the output voltage $V_{out}$ is generally less than the input voltage $V_{in}$ such that a switching operation of the power converter can regulate the output voltage $V_{out}$.

During a first portion D of a high-frequency switching cycle, the power switch $Q_{JFET}$ is enabled to conduct in response to a gate drive signal SD for a primary interval, coupling the input voltage $V_{in}$ to an output filter inductor $L_{out}$. During the a first portion D of the switching cycle, an inductor current $I_{Lout}$ flowing through the output filter inductor $L_{out}$ increases as current flows from the input to the output of the power train. An ac component of the inductor current $I_{Lout}$ is filtered by the output capacitor $C_{out}$.

During a second portion 1-D of the switching cycle, the power switch $Q_{JFET}$ is transitioned to a non-conducting state and an auxiliary power switch $Q_{aux}$ (e.g., an n-channel MOSFET), coupled to the output filter inductor $L_{out}$, is enabled to conduct in response to a gate drive signal $S_{1-D}$. The auxiliary power switch $Q_{aux}$ provides a path to maintain continuity of inductor current $I_{Lout}$ flowing through the output filter inductor $L_{out}$. During the second portion 1-D of the switching cycle, the inductor current $I_{Lout}$ flowing through the output filter inductor $L_{out}$ decreases. In general, the duty cycle of the power switch $Q_{JFET}$ and the auxiliary power switch $Q_{aux}$ may be adjusted to regulate the output voltage $V_{out}$ of the power converter. Those skilled in the art should understand, however, that the conduction periods for the two power switches may be separated by a small time interval to avoid cross conduction therebetween, and beneficially to reduce the switching losses associated with the power converter. Moreover, the auxiliary power switch $Q_{aux}$ can also be realized as a compound semiconductor device with the current path of an enhancement-mode device coupled in series therewith to prevent current backflow from an output terminal through the output filter inductor $L_{out}$ during a transient operating condition. Of course, a current path provided by a diode, which could be a body diode, would be included in the circuit to assure continuity of current flow through the output filter inductor $L_{out}$ when all active power switches may be disabled to conduct.

The controller 320 of the power converter receives the output voltage $V_{out}$ of the power converter and a desired output characteristic such as a desired system voltage $V_{system}$.

In a switch-mode power converter, such as the buck power converter illustrated and described with reference to FIG. 3, the duty cycle D of the power switch $Q_{JFET}$ determines the steady-state ratio of a power converter output voltage $V_{out}$ to its input voltage $V_{in}$. In particular, for a buck power converter typology operating in a continuous conduction mode, the duty cycle determines the ratio of output voltage to input voltage (ignoring certain losses within the power converter) according to the equation:

$$D=V_{out}/V_{in}$$

In an alternative power converter typology, such as a boost topology, the duty cycle may determine the ratio of output voltage to input voltage according to another equation.

Since the power switch $Q_{JFET}$ is a depletion-mode semiconductor device, MOSFET $Q_{FET}$ is coupled in series with power switch $Q_{JFET}$ to provide safe operation during a transient operating condition, such as previously described hereinabove. For example, during start up or during another transient operating condition, controller 320 provides a drive signal with zero volts on control lead $S_{FET}$ to the gate of MOSFET $Q_{FET}$ so that conductivity of the series circuit path including the input voltage source 310 can be disabled. During normal circuit operation, MOSFET $Q_{FET}$ is enabled to conduct continuously by controller 320 to preserve high-frequency switching characteristics provided by the compound semiconductor device $Q_{JFET}$.

During a fault condition, such as an excessive current level detected by current sensor 340 coupled in series with output node 330, controller 320 disables conductivity of MOSFET $Q_{FET}$ by coupling an appropriate signal on control lead $S_{FET}$ to apply zero volts to the gate of MOSFET with respect to its source.

The concept has thus been introduced of independently controlling the gates of a cascode arrangement of semiconductor devices, one of which is an enhancement-mode device, and the other, a depletion-mode device. In an embodiment, a switching system is formed with the depletion-mode semiconductor device and the enhancement-mode semiconductor device. The enhancement-mode semiconductor device has a current path coupled in series with a current path of the depletion-mode semiconductor device. A controller has a first output coupled to a control input of the depletion-mode semiconductor device and a second output coupled to a control input of the enhancement-mode semiconductor device. The controller causes the enhancement-mode semiconductor device to persistently conduct and the depletion-mode semiconductor device to intermittently conduct, thereby to intermittently control a conductivity of the switching system. In an embodiment, the controller causes the depletion-mode semiconductor device to intermittently conduct to regulate an output characteristic of a power converter, and disables conduction of the enhancement-mode semiconductor device during a transient operating condition of the switching system. A transient operating condition includes, without limitation, a start up, a shut-down, or a fault condition of the switching system, and a fault condition includes, without limitation, an overcurrent condition of the system.

In an embodiment, the depletion-mode semiconductor device is a compound semiconductor device, preferably a JFET. In a preferred embodiment, the depletion-mode semiconductor device is formed with an internal breakdown field strength of at least $10^6$ volts per cm. In an embodiment, the depletion-mode semiconductor device is disabled to conduct upon application of a negative voltage to a control terminal thereof with respect to its source. In an embodiment, the enhancement-mode device is a MOSFET.

Another exemplary embodiment provides a method of controlling conductivity of a switching system. In an embodiment, the method includes providing a depletion-mode semiconductor device with a current path coupled in series with a current path of an enhancement-mode semiconductor device. The method includes enabling the current path of the enhancement-mode semiconductor device to conduct, and intermittently switching the conductivity of the current path of the depletion-mode semiconductor device. The method further includes disabling the enhancement-mode semiconductor device to conduct during a transient operating condition of the switching system. A transient operating condition includes, without limitation, a start up, a shut-down, or a fault condition of the switching system, and a fault condition includes, without limitation, an overcurrent condition of the system. In an embodiment, the controller causes the depletion-mode semiconductor device to intermittently conduct to regulate an output characteristic of a power converter. The controller disables the enhancement-mode semiconductor device to conduct during a transient operating condition of the switching system.

In an embodiment, the method includes forming the depletion-mode semiconductor device with a compound semiconductor. In an embodiment, the compound semiconductor device comprises a silicon carbide device. In an embodiment, the depletion-mode device is a JFET. In an embodiment, the depletion-mode semiconductor device is formed with an internal breakdown field strength of at least $10^6$ volts per cm. In an embodiment, the enhancement-mode semiconductor device is a metal oxide silicon field effect transistor. In an embodiment, the method includes disabling conductivity of the depletion-mode semiconductor device with application of a negative voltage to a control terminal thereof with respect to its source.

Although a switching system formed with depletion-mode and enhancement-mode semiconductor devices with separately controlled gates and related methods has been described for application to power conversion, it should be understood that other applications of a switching system, such as power switching, are contemplated within the broad scope of the invention, and need not be limited to power conversion arrangements.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A switching system, comprising:
    a depletion-mode semiconductor device;
    an enhancement-mode semiconductor device, the enhancement-mode semiconductor device having a current path coupled in series with a current path of the depletion-mode semiconductor device; and
    a controller with a first output coupled to a control input of the depletion-mode semiconductor device and a second output coupled to a control input of the enhancement-mode semiconductor device, wherein the controller causes the enhancement-mode semiconductor device to persistently conduct and the depletion-mode semiconductor device to intermittently conduct to intermittently control a conductivity of the switching system, wherein the enhancement-mode semiconductor device is disabled to conduct during a transient operating condition of the switching system, and wherein the transient operating condition includes a fault condition, the fault condition including an overcurrent condition of the switching system.

2. The switching system as claimed in claim 1, wherein the transient operating condition further includes a start up or a shut-down condition of the switching system.

3. The switching system as claimed in claim 1, wherein the depletion-mode semiconductor device is disabled to conduct upon application of a negative voltage to a control terminal thereof with respect to its source.

4. The switching system as claimed in claim 1, wherein the depletion-mode semiconductor device comprises a compound semiconductor device.

5. The switching system as claimed in claim 4, wherein the compound semiconductor device comprises a silicon carbide device.

6. The switching system as claimed in claim 1, wherein the enhancement-mode semiconductor device comprises a metal oxide silicon field effect transistor.

7. The switching system as claimed in claim 1, wherein the depletion-mode semiconductor device is formed with an internal breakdown field strength of at least $10^6$ volts per centimeter.

8. The switching system as claimed in claim 1, wherein the controller causes the depletion-mode semiconductor device to intermittently conduct to regulate an output characteristic of a power converter.

9. The switching system as claimed in claim 1, wherein the controller disables the enhancement-mode semiconductor device to conduct during a transient operating condition of the switching system.

10. A method of controlling a conductivity of a switching system, the method comprising:
    providing a depletion-mode semiconductor device with a current path coupled in series with a current path of an enhancement-mode semiconductor device;
    enabling the current path of the enhancement-mode semiconductor device to conduct;
    intermittently switching conductivity of the current path of the depletion-mode semiconductor device; and
    disabling the enhancement-mode semiconductor device to conduct during a transient operating condition of the switching system, wherein the transient operating condition includes a fault condition, the fault condition including an overcurrent condition of the switching system.

11. The method as claimed in claim 10, wherein the transient operating condition further includes a start up or a shut-down condition of the switching system.

12. The method as claimed in claim 10, wherein the depletion-mode semiconductor device is disabled to conduct upon application of a negative voltage to a control terminal thereof with respect to its source.

13. The method as claimed in claim 10, wherein the depletion-mode semiconductor device comprises a compound semiconductor device.

14. The method as claimed in claim 13, wherein the compound semiconductor device comprises a silicon carbide device.

15. The method as claimed in claim 10, wherein the enhancement-mode semiconductor device comprises a metal oxide silicon field effect transistor.

16. The method as claimed in claim 10, wherein the depletion-mode semiconductor device is formed with an internal breakdown field strength of at least $10^6$ volts per centimeter.

17. The method as claimed in claim 10, wherein the controller causes the depletion-mode semiconductor device to intermittently conduct to regulate an output characteristic of a power converter.

18. The method as claimed in claim 10, wherein the controller disables the enhancement-mode semiconductor device to conduct during a transient operating condition of the switching system.

* * * * *